United States Patent
Tsuda et al.

[11] Patent Number: 5,992,791
[45] Date of Patent: Nov. 30, 1999

[54] TAPE TAKE-UP AND COVER-TAPE TAKE-UP APPARATUS

[75] Inventors: Mamoru Tsuda, Okazaki; Tokiyuki Kuno, Nagoya; Makoto Hosono, Okazaki, all of Japan

[73] Assignee: Fuji Machine Mfg. Co., Ltd., Chiryu, Japan

[21] Appl. No.: 09/115,768

[22] Filed: Jul. 15, 1998

[30] Foreign Application Priority Data

Aug. 11, 1997 [JP] Japan ................................ 9-216566

[51] Int. Cl.⁶ ........................... B65H 18/12; B65H 20/22; B65H 23/04
[52] U.S. Cl. .................................... 242/535.3; 242/535.5; 242/545.1; 242/597.2; 242/597.4; 242/608
[58] Field of Search ........................... 242/532.3, 535.3, 242/535.5, 538.1, 538.2, 545.1, 597.2, 597.4, 608, 609

[56] References Cited

U.S. PATENT DOCUMENTS

| | | | |
|---|---|---|---|
| 2,437,997 | 3/1948 | Charlin | 242/545.1 |
| 2,684,210 | 7/1954 | Conti | 242/545.1 |
| 2,845,232 | 7/1958 | Johnson et al. | 242/535.3 |
| 2,946,530 | 7/1960 | Trimble | 242/545.1 |
| 3,338,488 | 8/1967 | Hunt | 242/535.3 |
| 4,440,355 | 4/1984 | Mori et al. | 242/535.5 |
| 4,687,152 | 8/1987 | Hawkswell | 242/535.5 |

FOREIGN PATENT DOCUMENTS

| | | | |
|---|---|---|---|
| 3940071 | 6/1990 | Germany | 242/545.1 |
| 6-61687 | 3/1994 | Japan . | |

*Primary Examiner*—John M. Jillions
*Attorney, Agent, or Firm*—Oliff & Berridge, PLC

[57] ABSTRACT

A tape take-up for taking up a tape, including a first member having a first friction surface; and a second member including a drum portion for taking up the tape, and having a second friction surface, the drum portion having an axis line, at least one of the first and second friction surfaces including an annular friction surface concentric with the drum portion, the first and second members being combined with each other such that the first and second members are rotatable relative to each other about the axis line of the drum portion while the first and second friction surfaces are held in contact with each other, one of the first and second members including a permanent magnet, the other of the first and second members including a magnetic portion formed of a magnetic material, the permanent magnet and the magnetic portion having respective shapes which ensure that the permanent magnet and the magnetic portion are opposed to each other at any relative angular phase between the first and second members, the permanent magnet exerting, to the magnetic portion, a magnetic attraction force which causes the first and second friction surfaces to be held in contact with each other while the second member is not subjected to an external force greater than the magnetic attraction force, the magnetic attraction force permitting the second member to be separated from the first member when the second member is subjected to the external force.

12 Claims, 6 Drawing Sheets

TAPE TAKE-UP AND COVER-TAPE TAKE-UP APPARATUS

BACKGROUND OF THE INVENTION

1. Field of the Invention

The present invention relates to a tape take-up and a cover-tape take-up apparatus and particularly to the art of simplifying the construction of the tape take-up.

2. Related Art Statement

There is known a tape take-up which is employed in, e.g., a cover-tape take-up apparatus, for taking up a cover tape of a circuit-component ("CC") carrier tape. The CC carrier tape includes, in addition to the cover tape, a base tape having, at a predetermined pocket pitch in a lengthwise direction thereof, a plurality of pockets in which a plurality of circuit components ("CCs") such as electric-circuit or electronic-circuit components are accommodated, respectively, and which are closed by the cover tape adhered to the base tape. The CC carrier tape is fed by a tape feeding device at a predetermined feeding pitch equal to the predetermined pocket pitch, while the cover tape is peeled off the base tape. The CCs are picked up through respective openings of the pockets after the peeling of the cover tape, and the peeled cover tape is taken up by the cover-tape take-up apparatus.

The known tape take-up includes a first member, and a second member including a drum portion for taking up the cover tape. The first and second members include respective engageable portions, and are combined with each other by engaging the respective engageable portions with each other. In the combined state, the first and second members are not rotatable relative to each other. The second member can be separated from the first member by disengaging the engageable portions from each other. The cover-tape take-up apparatus includes a driving or rotating device including a rotatable drive member. The drive member is rotated at a predetermined angular pitch, and the rotation thereof is transmitted to the first member by a friction-utilizing transmitting mechanism. The second member is rotated with the first member, and the drum portion of the second member takes up the cover tape. As the amount of the cover tape taken up by the drum portion increases, the diameter of the cover tape wound around the drum portion increases and therefore the length of the cover tape taken up by unit-angle rotation of the drum portion increases. On the other hand, the length of the cover tape peeled off the base tape when the CC carrier tape is fed in each tape feeding operation, is constant, that is, equal to the predetermined feeding pitch, and the drive member is rotated at the predetermined angular pitch. Thus, the tape take-up is subjected to a tensile force applied thereto by the cover tape in a direction opposite to the direction in which the tape take-up takes up the cover tape. When a resistance torque applied to the tape take-up because of the tensile force exceeds a drive torque applied to the tape take-up because of the friction force produced by the friction-utilizing transmitting mechanism, the drive member is slid and rotated relative to the first member of the tape takeup. Thus, the peripheral speed of the tape take-up that corresponds to the diameter of the cover tape taken up and wound around the drum portion is always kept equal to the speed of feeding of the CC carrier tape. That is, the tape take-up takes up just the length of the cover tape peeled off the base tape during each tape feeding operation. When the tape take-up becomes full of the cover tape taken up from the CC carrier tape, an operator disengages the respective engageable portions of the first and second members, from each other, removes the second member from the first member, and engages the engageable portion of a new or empty second member to that of the first member so that the first member and the new second member are rotatable as a unit.

However, the known tape take-up requires that its first and second members include respective engageable portions which are engageable with each other for combining the first and second members such that the first and second members are not rotatable relative to each other, and needs a friction-utilizing transmitting mechanism which transmits the rotation of the drive member to the first member by utilizing the friction force produced between the drive member and the first member. Thus, the known tape take-up suffers from the complex construction. In addition, when the operator attaches and detaches the second member to and from the first member, he or she must engage and disengage the engageable portions of the first and second members with and from each other. However, those operations are cumbersome.

SUMMARY OF THE INVENTION

It is therefore a first object of the present invention to provide a tape take-up which includes a first member and a second member including a drum portion, has a simple construction, and allows the second member to be easily attached to, and detached from, the first member.

It is a second object of the present invention to provide a cover-tape take-up apparatus which has a simple construction.

The present invention provides a tape take-up and a cover-tape take-up apparatus which have one or more of the technical features which are described below in respective paragraphs given parenthesized sequential numbers (1) to (12). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed.

(1) According to a first feature of the present invention, there is provided a tape take-up for taking up a tape, comprising a first member having a first friction surface; and a second member comprising a drum portion for taking up the tape, and having a second friction surface, the drum portion having an axis line, at least one of the first and second friction surfaces comprising an annular friction surface concentric with the drum portion, the first and second members being combined with each other such that the first and second members are rotatable relative to each other about the axis line of the drum portion while the first and second friction surfaces are held in contact with each other, one of the first and second members comprising a permanent magnet, the other of the first and second members comprising a magnetic portion formed of a magnetic material, the permanent magnet and the magnetic portion having respective shapes which ensure that the permanent magnet and the magnetic portion are opposed to each other at any relative angular phase between the first and second members, the permanent magnet exerting, to the magnetic portion, a magnetic attraction force which causes the first and second friction surfaces to be held in contact with each other while the second member is not subjected to an external force greater than the magnetic attraction force, the magnetic attraction force permitting the second member to be separated from the first member when the second member is subjected to the external force. It is preferred that both of the first and second friction surfaces be annular. However, this is not essentially required. For example, one of the two friction surfaces may be provided by a plurality of discontinuous surfaces arranged along a circle. Meanwhile, it is also preferred that both of the permanent magnet and the magnetic portion have an annular cross section. However, it is possible that the permanent magnet and the magnetic portion be provided on the axis line of the drum portion about which the first and second members are rotatable relative to each other. In the latter case, both of the permanent magnet and the magnetic portion may have a circular cross section. In the present tape take-up, when the first member is rotated, the second member is also rotated because of the friction force produced between the first and second friction surfaces owing to the magnetic attraction force. Thus, the drum portion of the second member takes up the tape. In the previously-identified case where the drum portion takes up the cover tape peeled off the base tape of the CC carrier tape, the drum portion is subjected to the tensile force exerted thereto by the cover tape in the direction opposite to the direction in which the drum portion takes up the cover tape. When the resistance torque applied to the second member due to the tensile force exceeds the drive torque applied to the second member due to the friction force, the first member is slid and rotated relative to the second member while the first and second friction surfaces are held in contact with each other. Therefore, the drum portion, or the cover tape taken up by, and wound around, the drum portion, is effectively prevented from being rotated at a peripheral speed higher than the speed just needed to take up the cover tape peeled off the base tape. Thus, the cover tape is taken up without being excessively stretched, or broken. More specifically described, the magnetic force of the permanent magnet and the respective friction factors of the first and second friction surfaces are so pre-selected to produce, between the first and second friction surfaces, a friction force which applies, to the second member, a drive torque which ensures that the drum portion takes up a tape without excessively stretching, or breaking, the tape. As the diameter of the tape wound around the drum portion increases, the rotation angle of the second member just needed to take up the tape decreases, and the amount of sliding of the first member relative to the second member increases. Owing to the magnetic attraction force exerted by the permanent magnet to the magnetic portion, the first and second friction surfaces are held in frictional contact with each other. When a force greater than the magnetic attraction force is applied to the second member, the second member can be separated from the first member. Meanwhile, when the second member is moved relative to the first member in a direction in which the permanent magnet is moved toward the magnetic portion, the second member is attached to the first member. Thus, the second member is easily attached to, and detached from, the first member. In the present tape take-up, owing to the magnetic attraction force exerted by the permanent magnet to the magnetic portion, the first and second friction surfaces are held in frictional contact with each other and accordingly the second member is prevented from coming off the first member. In addition, the second member can be rotated relative to the first member while the second friction surface is held in contact with the first friction surface. Thus, the two friction surfaces, the permanent magnet, and the magnetic portion cooperate with each other to provide not only an engaging mechanism which engages the first and second members with each other but also a friction-utilizing drive-force transmitting mechanism which transmits the drive force from the first member to the second member, by utilizing the friction force produced between the two friction surfaces. Thus, the present tape take-up can take up a certain length of a tape, has a simple construction, and allows the second member to be easily attached to, and detached from, the first member. By the way, at least one of the first and second friction surfaces is annular, and the permanent magnet and the magnetic portion have respective shapes which ensure that the permanent magnet and the magnetic portion are opposed to each other at any relative angular phase between the first and second members. Therefore, when the first member is rotated relative to the second member, both the relative angular phase between the two friction surfaces and the relative angular phase between the permanent magnet and the magnetic portion change, but the two friction surfaces are kept held in contact with each other and accordingly the magnetic attraction force is maintained. In a situation in which the present tape take-up is not used for taking up a tape, the rotation of the second member relative to the first member is prevented by the frictional contact of the two friction surfaces. Thus, the drum portion of the second member is prevented from being rotated in a direction opposite to the direction of taking up of the tape, and accordingly the tape is prevented from being loosened, i.e., being kept stretched. The present tape take-up is capable of taking up not only the cover tape of the CC carrier tape and other tapes, such as a punched tape, each of which should be fed intermittently, i.e., at a predetermined feeding pitch, but also various tapes tape, such as a wrapping ribbon, each of which should be fed continuously.

(2) According to a second feature of the present invention which includes the first feature (1), at least one of the permanent magnet and the magnetic portion has an annular shape.

(3) According to a third feature of the present invention which includes the first or second feature (1) or (2), the tape take-up further comprises a driven member which is rotatable about the axis line, and the driven member is provided by an integral portion of the first member. When the driven member is rotated, the tape take-up is rotated for taking up the tape. Since the driven member is formed integrally with the first member, the total number of parts or elements of the tape take-up decreases, which contributes to simplifying the construction of the take-up.

(4) According to a fourth feature of the present invention which includes any one of the first to third features (1) to (3), the magnetic portion comprises an annular magnetic portion.

(5) According to a fifth feature of the present invention which includes the fourth feature (4), the annular magnetic portion forms one of the first and second friction surfaces which is held in contact with the permanent magnet which forms the other of the first and second friction surfaces. In this case, the other friction surface formed or provided by the permanent magnet may be annular like the one friction surface formed or provided by the annular magnetic portion.

(6) According to a sixth feature of the present invention which includes the fourth or fifth feature (4) or (5), the permanent magnet of the one of the first and second members comprises a plurality of portions which are located at a plurality of locations, respectively, which are axially symmetrical with each other with respect to the axis line. In this case, the permanent magnet is uniformly distributed around the axis line of the drum portion and accordingly the magnetic attraction force is generated uniformly around the axis line.

(7) According to a seventh feature of the present invention which includes any one of the fourth to sixth features (4) to (6), the permanent magnet comprises an annular permanent magnet, and the one of the first and second members further comprises a support portion to which the annular permanent magnet is fixed such that the annular permanent magnet is opposed to the annular magnetic portion of the other of the first and second members. Since both of the permanent magnet and the magnetic portion are annular, the magnetic attraction force is most effectively generated.

(8) According to an eighth feature of the present invention which includes any one of the first to seventh features (1) to (7), the first member comprises (a) a generally cylindrical axis portion which is fitable in an inner space of the drum portion of the second member such that the axis portion and the drum portion are rotatable relative to each other about the axis line, and (b) a flange portion which extends radially outward from the axis portion. The flange portion prevents the tape taken up by, and wound around, the drum portion, from coming off the drum portion in a direction parallel to the axis line of the drum portion. The flange portion may be provided by a flange member which is separate from the axis portion and which is formed of a magnetic material. In the latter case, the flange member includes the magnetic portion as an integral portion thereof, and the production cost of the first member is reduced as compared with the case where the first member is entirely formed of a magnetic material. The axis portion of the first member and the drum portion of the second member cooperate with each other to provide a positioning device which positions the first and second members relative to each other in a direction perpendicular to the axis line of the drum portion. It is preferred that the axis portion of the first member include a tapered free end portion whose diameter decreases in a direction toward the free end, thereby providing a guide surface for guiding the fitting of the drum portion on the axis portion. In the case where the axial length of the axis portion is substantially equal to that of the drum portion, the drum portion is prevented from being inclined relative to an axis line of the axis portion. Thus, the drum portion can stably take up the tape. It is preferred that the axial length of the axis portion be shorter than that of the drum portion for the purpose of reducing the width of the tape take-up.

(9) According to a ninth feature of the present invention which includes any one of the first to eighth features (1) to (8), the second member comprises a flange portion which extends radially outward from the drum portion. The flange portion prevents the tape taken up by, and wound around, the drum portion, from coming off the drum portion in a direction parallel to the axis line of the drum portion. In the case where the first and second members have respective flange portions, the present tape take-up provides a tape take-up reel wherein the two flange portions cooperate with each other to prevent reliably the tape wound around the drum portion from coming off the same. However, it is possible that the first and second members do not include any flange portions. That is, the tape take-up may be provided by the first member consisting of the axial portion and the second member consisting of the drum portion. Alternatively, it is possible that the second member include two flange portions which extend radially outward from axially opposite end portions of the drum portion, respectively. In the latter case, the tape is taken up by an intermediate portion of the drum portion between the two flange portions. This tape take-up provides a tape take-up reel. The first member may not include any flange portion.

(10) According to a tenth feature of the present invention, there is provided a cover-tape take-up apparatus for taking up a cover tape which is peeled off a circuit-component carrier tape which includes, in addition to the cover tape, a base tape having, at a predetermined pitch in a lengthwise direction thereof, a plurality of pockets in which a plurality of circuit components are accommodated, respectively, and which are closed by the cover tape, the apparatus comprising a cover-tape take-up which comprises a first member having a first friction surface, and a second member comprising a drum portion for taking up the cover tape, and having a second friction surface, at least one of the first and second friction surfaces comprising an annular friction surface concentric with the drum portion, the first and second members being combined with each other such that the first and second members are rotatable relative to each other about an axis line of the drum portion while the first and second friction surfaces are held in contact with each other; a supporting device which supports the cover-tape take-up such that the cover-tape take-up is rotatable about the axis line; a magnetic pressing device which comprises a permanent magnet and an attracted member formed of a magnetic material, and which exerts, in at least a state in which the cover-tape take-up is supported by the supporting device, a magnetic attraction force to the attracted member and thereby causes the first and second friction surfaces of the first and second members to be pressed on each other, the magnetic attraction force permitting the second member to be separated from the first member when the second member is subjected to an external force greater than the magnetic attraction force; and a rotating device which rotates the first member at a predetermined angular pitch about the axis line. The permanent magnet and the attracted member may be provided either between the first and second members like in the tape take-up in accordance with the first feature (1), or between the second member and the supporting device. In either case, in at least the state in which the cover-tape take-up is supported by the supporting device, the magnetic attraction force can be exerted to the attracted member, so that the first and second friction surfaces of the first and second members may be pressed on each other. In the case where the permanent magnet and the attracted member are provided between the first and second members, the pressing force resulting from the magnetic attraction force is produced only between the two friction surfaces, but not between the cover-tape take-up and the supporting device, that is, produced as an internal force of the cover-tape take-up. On the other hand, in the case where the permanent magnet and the attracted member are provided between the second member and the supporting device, the pressing force from the magnetic attraction force is produced not only between the first and second members, but also between the cover-tape take-up and the supporting device. Therefore, it is preferred that a thrust bearing be provided between the cover-tape take-up and the supporting device, for reducing a frictional resistance resulting from the magnetic attraction force. The thrust bearing may be a rolling bearing or a slide bearing. The slide bearing may be formed of a material, such as Teflon or white metal, which has a small friction factor. When the first member is rotated by the rotating device, the rotation of the first member is transmitted to the second member owing to the frictional force produced between the first and second friction surfaces, so that the second member rotates and the drum portion thereof takes up the cover tape. As described above, when the resistance torque applied to the second member because of the tensile force of the cover tape exceeds the drive torque applied to the second member because of the frictional force, the first member slides and rotates relative to the second member while the first and second friction surfaces are held in frictional contact with each other, so that the drum portion of the second member, or the outer surface of the cover tape wound around the drum portion rotates at a peripheral speed equal to the speed of feeding of the CC carrier tape. Thus, a one-pitch length of the cover tape is taken up. If otherwise the second member would be rotated with the first member as if they were a unit, the amount of taking up of the cover tape by the drum portion would exceed the one-pitch length. In contrast, in the cover-tape take-up, the first member is slid relative to the second member, which leads to preventing an excessive amount the cover tape from being taken up. That is, the second member is rotated by a necessary angle, and takes up just a one-pitch length of the cover tape without excessively stretching or breaking the cover tape. As the amount of the cover tape taken up by the drum portion increases and accordingly the diameter of the taken-up cover tape increases, the rotation angle of the drum portion needed for taking up the one-pitch length of the cover tape decreases and the amount of sliding of the first member relative to the second member increases. The cover-tape take-up of the present cover-tape take-up apparatus may have at least one of the above-described first to ninth features (1) to (9), and the present apparatus may enjoy at least one of the advantages of those features (1) to (9).

(10) According to a tenth feature of the present invention, there is provided a cover-tape take-up apparatus for taking up a cover tape which is peeled off a circuit-component carrier tape which includes, in addition to the cover tape, a base tape having, at a predetermined pocket pitch in a lengthwise direction thereof, a plurality of pockets in which a plurality of circuit components are accommodated, respectively, and which are closed by the cover tape, the apparatus comprising a drive member which is rotatable about an axis line and has a first friction surface; a supporting device which supports the drive member such that the drive member is rotatable about the axis line; a rotating device which rotates the drive member at a predetermined angular pitch about the axis line; a cover-tape take-up which comprises a drum portion for taking up the cover tape, and has a second friction surface, at least one of the first and second friction surfaces comprising an annular friction surface whose center is located on the axis line, the first and second friction surfaces contacting with each other in a direction parallel to the axis line, the cover-tape take-up being rotated about the axis line by a drive torque resulting from a friction between the first and second friction surfaces, when the drive member is rotated by the rotating device, so that the drum portion takes up the cover tape, the cover-tape take-up being rotated relative to the drive member when the cover-tape take-up is subjected to a resistant torque greater than the drive torque; and a magnetic pressing device which comprises a permanent magnet and an attracted member formed of a magnetic material, and which exerts, in at least a state in which the cover-tape take-up is supported by the supporting device, a magnetic attraction force to the attracted member and thereby causes the first and second friction surfaces of the drive member and the cover-tape take-up to be pressed on each other, the magnetic attraction force permitting the cover-tape take-up to be separated from the drive member when the cover-tape take-up is subjected to an external force greater than the magnetic attraction force. The drive member of the present cover-tape take-up apparatus is readable on the first member of the cover-tape take-up of the cover-tape take-up apparatus in accordance with the tenth feature (10), and the cover-tape take-up of the present apparatus is readable on only the second member of the cover-tape take-up of the apparatus in accordance with the tenth feature (10).

(12) According to a twelfth feature of the present invention which includes the eleventh feature (11), the rotating device comprises a synchronism rotating device which rotates, in synchronism with a feeding of the circuit-component carrier tape at a predetermined feeding pitch equal to the predetermined pocket pitch, the drive member at a speed corresponding to a circumferential speed of the drum portion of the cover-tape take-up which is not lower than a speed of the feeding of the carrier tape. The circumferential (i.e., peripheral) speed of the drum portion is one which would be obtained in an assumed state in which no cover tape is taken up by the drum portion. When the drum portion actually takes up the cover tape, the peripheral speed of the drum portion or the outer surface of the cover tape taken up by the drum portion is made, owing to the tensile force of the cover tape, equal to the speed of feeding of the CC carrier tape, as described above in connection with the tenth feature (10). In the present apparatus, since the drive member is rotated at a speed corresponding to a circumferential speed of the drum portion that is not lower than a speed of the feeding of the carrier tape, the amount of rotation of the drive member is sufficient for taking up not less than a one-pitch length of the cover tape, already at the beginning of taking up of the cover tape. An excessive amount of rotation of the drive member is absorbed by the sliding thereof relative to the cover-tape take-up. Thus, the present apparatus can surely take up a one-pitch length of the cover tape already at the beginning of the cover-tape taking-up operation. Since the synchronism rotating device rotates the drive member in synchronism with the feeding of the CC carrier tape, the wearing of the first and second friction surfaces is reduced as such. However, the rotating device may otherwise be one which continuously rotates the drive member. The synchronism rotating device may be one which shares a common drive source with a tape feeding device which feeds the CC carrier tape. For example, the synchronism rotating device may include an electric motor as the common drive source, a common drive pulley, and a first driven pulley which is formed integrally with the drive member and which receives a predetermined angle or amount of rotation of the common motor via the common drive pulley, and the tape feeding device may the common motor, the common drive pulley, and a second driven pulley which is formed integrally with a sprocket engaged with the CC carrier tape and which receives the same amount of rotation of the common motor via the common drive pulley. In this case, in view of the diameter of the drum portion and the diameter of the sprocket except its circumferential teeth, the respective diameter of the first and second driven pulleys are so pre-determined that the peripheral speed of the drum portion is not lower than the speed of feeding of the CC carrier tape. Thus, upon actuation of the common motor, the feeding of the carrier tape starts and simultaneously the rotation of the drive member starts to take up the cover tape. The synchronism rotating device rotates the drive member at a speed corresponding to a peripheral speed of the drum portion that is not lower than the speed of the feeding of the carrier tape. However, it is not essentially required that the synchronism rotating device and the tape feeding device include a common drive source, that is, the two devices may include respective exclusive drive sources for taking up the cover tape and feeding the carrier tape, respectively. In the last case, the synchronism rotating device may additionally include a control device which controls the two exclusive drive sources to synchronize the taking up of the cover tape with the feeding of the carrier tape.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Referring to FIGS. 1 to 5, there will be described a circuit-component ("CC") feeder 10 including a cover-tape take-up apparatus 16 which embodies the present invention, and which includes a cover-tape take-up reel 84 which also embodies the present invention.

Figure 1:
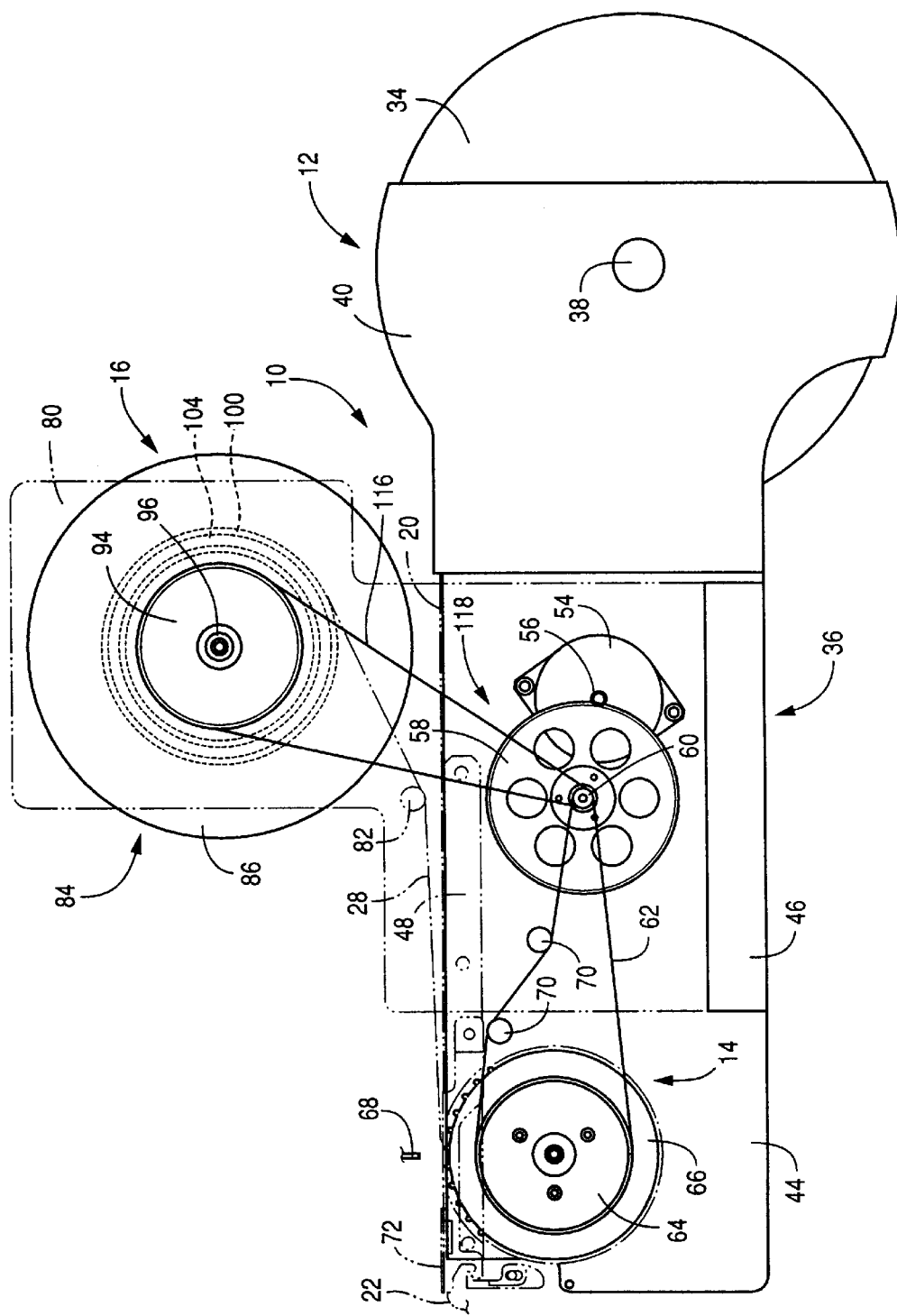
FIG. 1 is a front elevation view of a circuit-component ("CC") feeder including a cover-tape take-up apparatus which embodies the present invention and which includes a cover-tape take-up reel which also embodies the present invention.

In FIG. 1, the CC feeder 10 includes a tape holding device 12, a tape feeding device 14, and the cover-tape take-up apparatus 16. Thus, the CC feeder 10 feeds a plurality of circuit components ("CCs") 26 in the form of a CC carrier tape 20 shown in FIGS. 3 and 4. The CC carrier tape 20 includes a base tape 22 having, at a predetermined pitch in a lengthwise direction thereof, a number of pockets 24 in which the CCs 26 are accommodated, respectively, and which are closed by a cover tape 28 adhered to the base tape 22. The base tape 22 has a number of feed holes 30 formed at a predetermined pitch through the thickness of one of widthwise opposite end portions thereof which extend parallel to the lengthwise direction thereof. The widthwise opposite end portions of the base tape 22 are supported by the tape feeding device 14 when the CC carrier tape 20 is fed by the feeding device 14.

As shown in FIG. 1, the CC carrier tape 20 is wound around a reel 34, and the reel 34 is detachably attached to a reel holder 40 such that the reel 34 is supported by an axis member 38. The reel holder 40 and the axis member 38 cooperate with each other to provide the tape holding device 12. The reel holder 40 provides a portion of a main frame 36 of the CC feeder 10.

The main frame 36 includes, in addition to the reel holder 40, a plurality of members including two side plates 44, an attaching member 46, and a guide member 48. The reel holder 40 and those members are assembled into the main frame 36 as an integral member. The reel holder 40 is attached to respective rear end portions of the side plates 44. The main frame 36 has an elongate shape. A positioning device and a fixing device (not shown) position and fix the main frame 36 on and to a feeder support table (not shown) such that the main frame 36 stands upright, that is, the lengthwise direction, and the widthwise direction (i.e., direction of thickness), of the main frame 36 are horizontal. A plurality of CC feeders 10 are fixed to the feeder support table such that respective CC-supply portions of the CC feeders 10 are arranged along a reference straight line. The CC feeders 10 and the feeder support table cooperate with each other to provide a CC supplying device.

The CC supplying device provides a portion of a CC mounting system, and supplies the CCs 26 to a CC mounting device of the CC mounting system so that the CC mounting device mounts the CCs 26 on a printed circuit board ("PCB") as a sort of a circuit substrate. The CC mounting device may be one which includes a rotatable body which is rotatable about a vertical axis line, intermittently, i.e., at a regular angular rotation pitch; a plurality of CC suction heads, each as a sort of CC mounting head, which are mounted on the rotatable table such that the CC suction heads are spaced from each other about the axis line, equiangularly, i.e., at a regular angular spacing pitch equal to the regular angular rotation pitch; and a drive device which intermittently rotates the rotatable body about the axis line. In this case, the CC suction heads are sequentially moved to a CC sucking position where each of the CC suction heads picks up a CC 26 from the CC supplying device, and to a CC mounting position where the each CC suction head mounts the CC 26 on the PCB. And, the feeder support table is moved by a support-table moving device in a direction parallel to a straight line along which the respective CC-supply portions of the CC feeders 10 are arranged, so that those CC-supply portions are sequentially positioned at a CC supplying position right below the CC suction head being positioned at the CC sucking position, and each of the CC-supply portions supplies a CC 26 to the CC suction head.

Alternatively, the CC mounting device may be one which includes an X-Y table which is movable in each of an X direction and a Y direction which are perpendicular to each other in a horizontal plane; and at least one CC suction head which is mounted on the X-Y table. In this case, the CC suction head is moved by the movement of the X-Y table to any desired position in the horizontal plane where the CC suction head picks up a CC 26 from one of the CC feeders 10 of the CC supplying device, and is moved to any desired position on the PCB where the CC suction head mounts the CC 26. And, the feeder support table is not moved, i.e., is fixed at a prescribed position.

As shown in FIG. 1, the tape feeding device 14 is supported by the main frame 36, and includes an electric motor 54 as a sort of drive source, a drive gear 56 fixed to an output shaft of the motor 54, a driven gear which is meshed with the d rive gear 56 and has a greater number of teeth than that of the teeth of the drive gear 56, a drive pulley 60 which is formed integrally with the driven gear 58, a drive belt 62 which transmits the rotating force of the drive pulley 60, a driven pulley 64 which is driven by the drive belt 62, and a sprocket 66 which is formed integrally with the driven pulley 64. The tape feeding device 14 feeds the CC carrier tape 20 such that the leading one of the CC accommodating pockets 24 from which the cover tape 28 has been peeled, is moved to a CC pick-up position right below a CC suction head 68 as a sort of CC mounting head which is positioned at the CC sucking position. The CC-supply portion of the CC feeder 10 means a portion of the feeder 10 which includes the CC pick-up position. The electric motor 54 is a pulse motor. The amount or angle of rotation of the sprocket 66 can be controlled by the number of pulses supplied to the motor 54. In the case where the operation of the motor 54 occurs in a predetermined operation time period, the rotation amount of the sprocket 66 is controlled by changing the number of pulses supplied to the motor 54 in the operation time period. Alternatively, in the case where the rate at which pulses are supplied to the motor 54 (i.e., the number of pulses supplied to the motor 54 per unit time) is constant, the rotation amount of the sprocket 66 is controlled by changing an operation time period in which the operation of the motor 54 occurs. Thus, even if the current CC carrier tape 20 having a first pocket pitch at which CC accommodating pockets 24 are formed is followed by another sort of CC carrier tape 20 having a second pocket pitch different from the first pocket pitch, the tape feeding device 14 can easily deal with the change of the first pocket pitch to the second pocket pitch. The drive and driven pulleys 60, 64 are timing pulleys, and the drive belt 62 is a timing (e.g., cog) belt.

A plurality of guide rollers 70 cooperate with each other to define a route along which the drive belt 62 is passed or circulated. The guide rollers 70 are tension rollers which are rotatably held by respective levers (not shown) which are rotatably supported by the side plates 44 and are biased by respective springs, each as a sort of biasing device, in respective directions to contact and stretch the drive belt 62.

A leading portion of the CC carrier tape 20 which is wound around the reel 34 is drawn by an operator from the reel 34, and is guided by the guide member 48 to the side of the sprocket 66. The guide member 48 has a shape like a block, and is fixed to respective front and upper portions of the two side plates 44 such that the guide member 48 extends parallel to the lengthwise direction of the side plates 44 (i.e., a front-rear direction of the CC feeder 10). The guide member 48 has two support portions which support the widthwise opposite end portions of the base tape 22, respectively, and a groove through which the CC accommodating pockets 24 pass. The leading portion of the base tape 22 of the CC carrier tape 20 that is drawn from the reel 34 is guided by the guide member 48, while some of the feed holes 30 of the base tape 22 are engaged with some of a number of projections of the sprocket 66 which are equidistantly or equiangularly formed along the outer circumference of the sprocket 66. A cover member 72 covers the leading portion of the CC carrier tape 20, and prevents the leading portion of the base tape 66 from moving up, i.e., disengaging from the sprocket 66. Thus, some feed holes 30 of the base tape 22 are reliably engaged with some projections of the sprocket 66.

Figure 5:
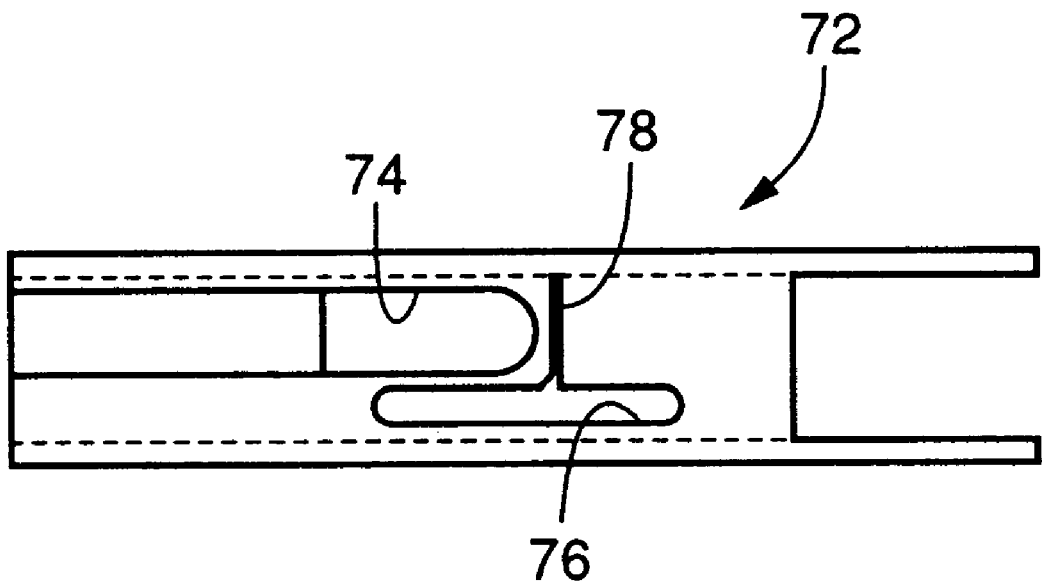
FIG. 5 is a plan view of a cover member which covers the CC carrier tape fed by the CC feeder of FIG. 1.

As shown in FIG. 5, the cover member 72 has an opening 74 at a position corresponding to the CC pick-up position. Thus, the CC suction head 68 picks up each CC 26 through the opening 74. In addition, the cover member 72 has an elongate hole 76 at a position corresponding to the projections of the sprocket 66. Thus, the cover member 72 does not interfere with the sprocket 66 which feeds the CC carrier tape 20. Moreover, the cover member 72 has a slit 78 at a position slightly upstream of the opening 74 as seen in a tape feeding direction in which the CC carrier tape 20 is fed by the tape feeding device 14. The slit 78 extends in a direction perpendicular to the tape feeding direction. A portion of the cover tape 28 which has been peeled off the base tape 22 is drawn through the slit 78 and is taken up by the cover-tape take-up apparatus 16. The slit 78 defines a cover-tape peeling position where the cover tape 28 is peeled off the base tape 22. A portion of the base tape 22 from which the CCs 26 have been picked up is dealt with in an appropriate manner, e.g., is further fed to a cutting device which cuts that portion into small pieces, or to a collecting device which collects that portion.

Next, the cover-tape take-up apparatus 16 will be described. The attaching member 46 as a portion of the main frame 36 has a shape like a block, and is fixed to respective intermediate and lower portions of the two side plates 44 such that the attaching member 46 extends parallel to the lengthwise direction of the side plates 44. A bracket 80 is fixed to the attaching member 46, and cooperates with the attaching member 46 and other members to provide the main frame 36. The bracket 80 has a plate-like shape, and extends upward over the guide member 48, parallel to one side plate 44, such that the bracket 80 is opposed to the drive pulley 60. A guide roller 82 is rotatably fixed to the bracket 80, and a cover-tape take-up reel 84 as a sort of tape take-up is rotatably attached to the bracket 80.

Figure 2:
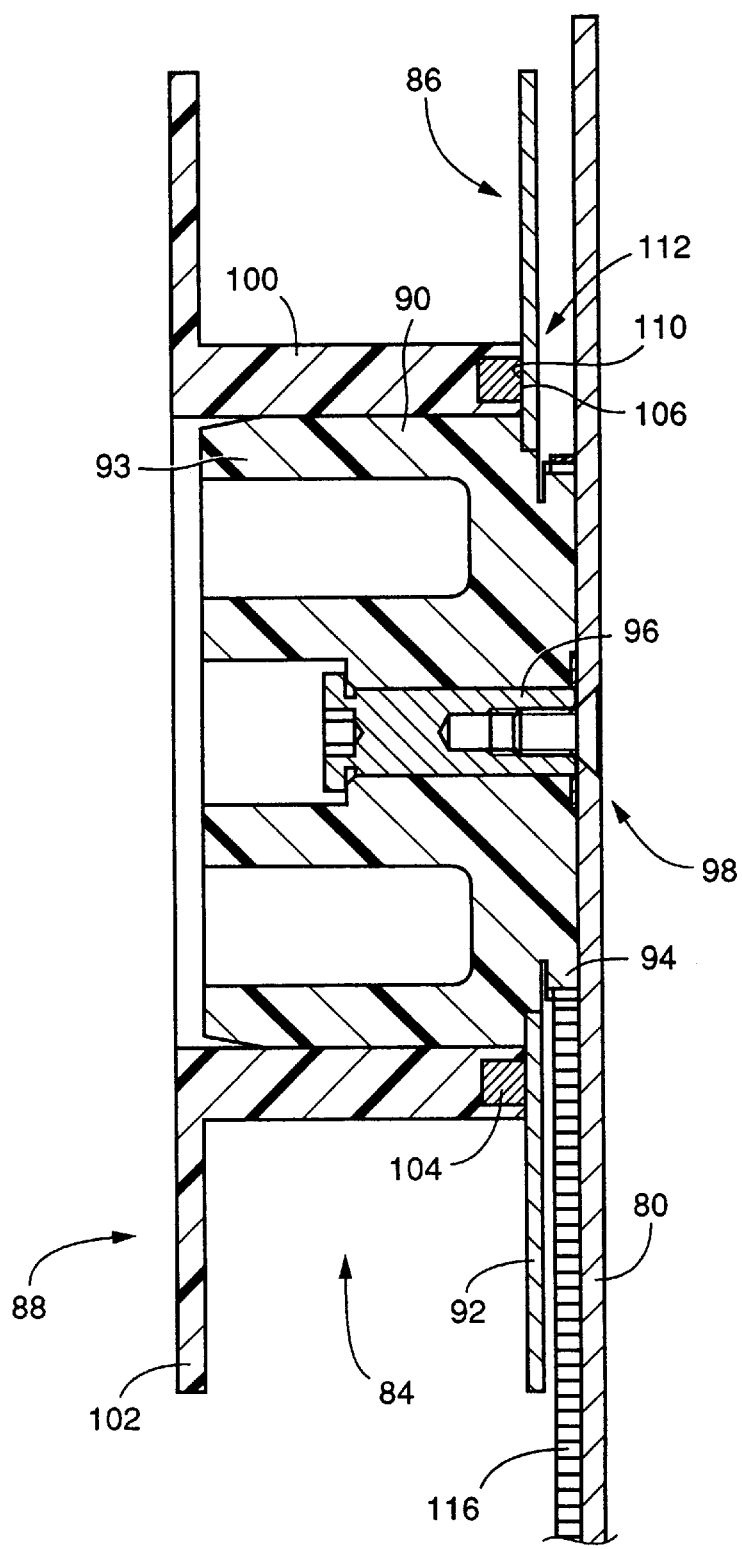
FIG. 2 is a cross-sectioned, side elevation view of the cover-tape take-up reel of FIG. 1.
Figure 3:
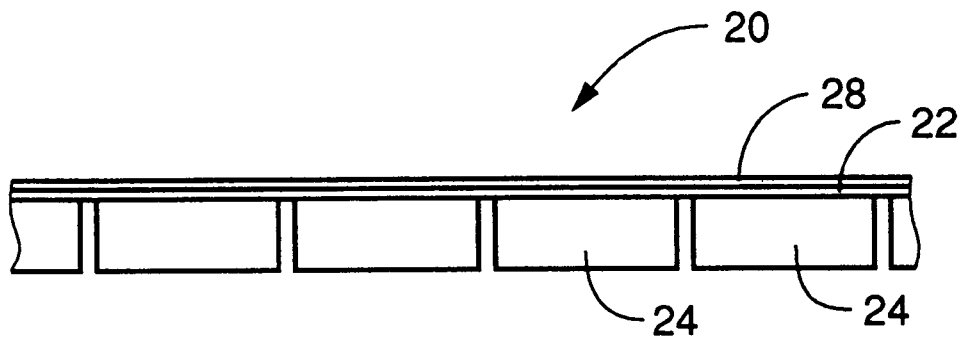
FIG. 3 is a front elevation view of a CC carrier tape which is fed by the CC feeder of FIG. 1.
Figure 4:
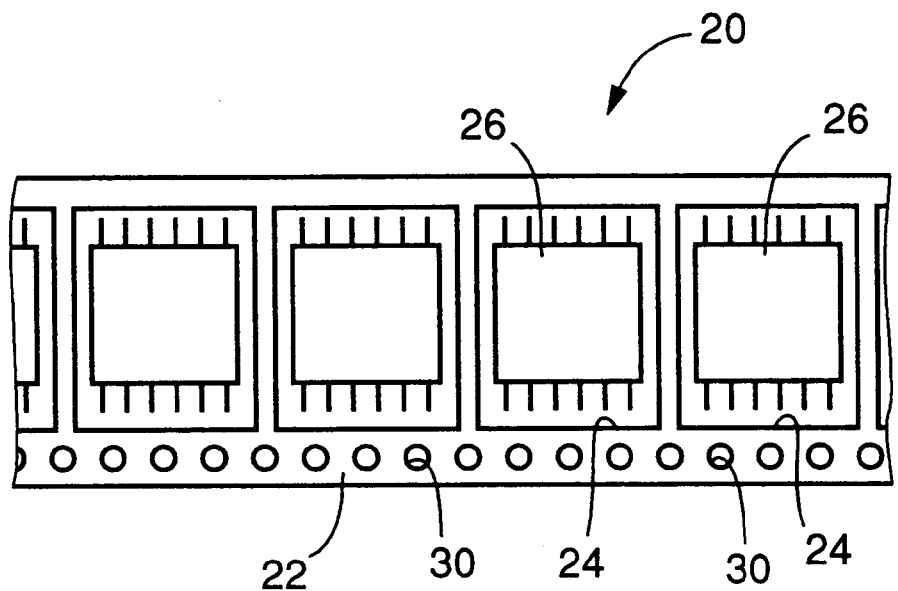
FIG. 4 is a plan view of the CC carrier tape of FIG. 3 with a cover tape being removed therefrom.

As shown in FIG. 2, the take-up reel 84 includes a first member 86 and a second member 88 which are combined with each other such that the first and second members 86, 88 are rotatable relative to each other. The first member 86 includes an axis member 90 which has a circular cross section, and an annular member 92 which is fitted on, and is fixed to, one of axially opposite end portions of the axis member 90. The axis member 90 is formed of a synthetic resin as a sort of non-magnetic material, and the other axial end portion of the axis member 90 provides a tapered guide portion 93 whose diameter continuously decreases in a direction toward the end surface thereof. The annular member 92 is formed of a magnetic material such as iron, and has an outer diameter greater than the diameter of the axis member 90 and accordingly provides a flange portion which projects radially outward from the axis member 90. The axis member 90 has, as an integral portion thereof, a driven pulley 94 adjacent to the one axial portion thereof on which the annular member 92 is fitted. That is, the first member 86 includes a driven portion as an integral portion thereof. The driven pulley 94 is a timing pulley. The first member 86 is supported by an axis member 96 fixed to the bracket 80, such that the first member 86 is rotatable about the axis member 96. The bracket 80 and the axis member 96 cooperate with each other to provide a supporting device 98 which supports the take-up reel 84. Respective axis lines of rotation of the output shaft of the motor 54, the drive gear 56, the driven gear 58, the drive pulley 60, the driven pulley 64, the sprocket 66, the guide rollers 70, 82, and the cover-tape take-up reel 84 are parallel to each other and are parallel to the widthwise direction of the CC feeder 10.

The second member 88 is formed of a synthetic resin, and includes a take-up drum portion 100 which is externally fitable on the axis member 90, and a flange portion 102 which projects radially outward from one of axially opposite end portions of the drum portion 100. The other axial end portion of the drum portion 100 has an annular groove which opens in the end surface thereof and in which an annular permanent magnet 104 is fitted and fixed in an appropriate manner such as using an adhesive. The annular permanent magnet 104 has an annular end surface which is flush with the end surface of the drum portion 100. This annular end surface provides an annular friction surface 106.

The second member 88 is combined with the first member 86 such that the drum portion 100 is externally fitted on the axis member 90 and the annular friction surface 106 is held in contact with the annular member 92. An annular portion of the annular member 92 which is opposed to the permanent magnet 104 provides an annular magnetic portion, or an attracted member which is attracted by the magnet 104. An annular surface of the annular member 92 which is held in contact with the annular friction surface 106 provides an annular friction surface 110. In the present embodiment, the magnetic portion is formed integrally with the flange portion. The two friction surfaces 106, 110 are held in frictional contact with each other because of the magnetic attraction force of the permanent magnet 104 exerted to the magnetic portion. Thus, the permanent magnet 104 cooperates with the portion of the annular member 92 which functions as the attracted member, to provide a magnetic pressing device 112. Since the first and second members 86, 88 are combined with each other such that the drum portion 100 having an annular cross section is fitted on the axis member 90 having a circular cross section and such that the two friction surfaces 106, 110 are held in frictional contact with each other, the two members 86, 88 can be rotated relative to each other about an axis line.

The axis member 90 has an axial length slightly shorter than that of the drum portion 100. In a state in which the drum portion 100 is fitted on the axis member 90, the first and second members 86, 88 are positioned relative to each other in a direction perpendicular to the axis line about which the two members 86, 88 are rotatable relative to each other. Thus, the second member 88 is attached to the first member 86, without being inclined with respect to the above axis line.

The second member 88 can be detached from the first member 86, by applying, to the second member 88, a force greater than the magnetic attraction force exerted to the annular member 92, in a direction in which the drum portion 100 is separated from the annular member 92. When the second member 88 is attached to the first member 86, the drum portion 100 is externally fitted on the axis member 90. The fitting of the drum portion 100 onto the axis member 90 is guided by the tapered guide portion 93 of the axis member 90. When the drum portion 100 is moved relative to the axis member 90 till the permanent magnet 104 contacts the annular member 92, the drum portion 100 is attracted to the annular member 92 so that the two friction surfaces 106, 110 are held in frictional contact with each other.

A portion of the cover tape 28 that has been peeled off the base tape 22 and drawn through the slit 78 of the cover member 72, is deflected by the guide roller 82 and then is wound around the drum portion 100 of the take-up reel 84. As shown in FIG. 1, the cover tape 28 is deflected by a lower portion of the guide roller 82, and then is wound around the drum portion 100 such that one of opposite major surfaces of the cover tape 28 that had been adhered to the base tape 22 faces radially inward.

The rotation of the drive pulley 60 of the tape feeding device 14 is transmitted to the driven pulley 94 formed integrally with the first member 86, via the drive belt 116. The diameter of the driven pulley 94 is equal to that of the driven pulley 64 of the tape feeding device 14, and the outer diameter of the drum portion 100 is greater than the effective diameter of the sprocket 66, i.e., the diameter which does not include the projections of the sprocket 66. The drive pulley 60 has a sufficiently great axial length which ensures that the two drive belts 62, 116 can be wound thereon. The drive belt 116 is nearer to the driven gear 58 than the drive belt 62. The driven pulley 94, the drive belt 116, the drive pulley 60, the driven gear 58, the drive gear 56, and the motor 54 cooperate with one another to provide a synchronism drive device 118 as a rotating device. The synchronism drive device 118 and the tape feeding device 14 share the motor 54, the drive gear 56, the driven gear 58, and the drive pulley 60.

When the CC carrier tape 20 is fed by the CC feeder 10 constructed as described above, the electric motor 54 is activated. Consequently the sprocket 66 is rotated via the drive gear 56, the driven gear 58, the drive pulley 60, the driven pulley 64, and the drive belt 62, so that the CC carrier tape 20 is fed forward. The carrier tape 20 is fed at a feeding pitch equal to the pocket pitch at which the CC accommodating pockets 24 are formed in the lengthwise direction of the carrier tape 20. The leading one of the CCs 26 from which the cover tape 28 has been removed is fed to the CC pick-up position.

Concurrently with the rotation of the sprocket 66, the first member 86 is rotated via the drive pulley 60, the drive belt 116, and the driven pulley 94. In a normal state, the respective friction surfaces 106, 110 of the first and second members 86, 88 are held in frictional contact with each other because of the magnetic attraction force of the permanent magnet 104 exerted to the magnetic portion of the annular member 92. Accordingly, when the first member 86 is rotated, the second member 88 is also rotated because of the friction force produced between the friction surfaces 106, 110 by the magnetic attraction force. Thus, the cover tape 28 is taken up onto the drum portion 100 while being peeled off the base tape 22 of the CC carrier tape 20 being fed by the tape feeding device 14. In the present embodiment, the cover-tape take-up device 84 also functions as a cover-tape peeling device.

When a take-up operation starts, the drum portion 100 itself peels and takes up the cover tape 28 at a peripheral speed equal to a speed at which the CC carrier tape 20 is fed. After a certain length of the cover tape 28 has been taken up by the drum portion 100, the thus taken-up cover tape 28 peels and takes up the cover tape 28 at the peripheral speed equal to the speed of feeding of the carrier tape 20. In either case, the first member 86 transmits the rotation thereof to the second member 88, while rotating relative to the second member 88.

Since the respective diameters of the driven pulleys 64, 94 are equal to each other and the outer diameter of the drum portion 100 is greater than the effective diameter of the sprocket 66, the drum portion 100 should be rotated at a peripheral speed higher than a speed at which the CC carrier tape 20 is fed by the rotation of the sprocket 66. However, in a state in which a length of the cover tape 28 is wound around the drum portion 100, the cover tape 28 applies a tensile force to the second member 88 in a direction opposite to the direction in which the second member 88 is driven or rotated by the first member 86. The first member 86 is forcedly rotated by the motor 54, and the diameter of the drum portion 100 of the second member 88 is greater than that of the sprocket 66. Accordingly, when the motor 54 is rotated by a unit angle, the drum portion 100 can take up a greater length of the cover tape 28 than a length of the carrier tape 20 fed by the tape feeding device 14. Thus, already when the take-up operation starts, the angle of rotation of the first member 86 needed to take up one pitch of cover tape 28 is greater than that of the second member 88. However, just one pitch of cover tape 28 can be peeled each time the carrier tape 20 is fed by the tape feeding device 14, because the cover-tape peeling position is defined by the slit 78 of the cover member 72 and accordingly no additional length of the cover tape 28 is peeled off the base tape 22. Therefore, already when the take-up operation starts, the cover tape 28 applies a tensile force to the second member 88. When a resistance torque applied to the second member 88, resulting from the tensile force of the cover tape 28, exceeds a drive torque applied to the same 88, resulting from the friction force produced between the friction surfaces 106, 110 because of the magnetic attraction force, the first member 86 is rotated or slid relative to the second member 88 while being held in frictional contact with each other. Thus, the drum portion 100 is allowed to take up each pitch of the cover tape 28 at a peripheral speed equal to a speed at which the carrier tape 20 is fed.

If the second member 88 would otherwise rotate together with the first member 86, the drum portion 100 would take up more than one pitch of the cover tape 28. However, since the first member 86 slides relative to the second member 88, such excessive length of the cover tape 28 is not taken up. That is, already when the take-up operation starts, the second member 88 is rotated by an angle just needed to take up the cover tape 28. Therefore, the cover tape 28 is not excessively stretched or shrunk, and each pitch of the cover tape 28 is stably take up by the drum portion 100. To this end, the magnetic force of the permanent magnet 104 and the respective friction factors of the friction surfaces 106, 100 are pre-selected. In addition, since the tape feeding device 14 and the drive device 118 share the motor 54 and other members, the rotation of the motor 54 is simultaneously transmitted to the sprocket 66 and the first member 86, so that the feeding of the carrier tape 20 and the taking up of the cover tape 28 occur in synchronism with each other. Thus, the drive device 118 which rotates the first member 86 is a synchronism drive device. Since the respective diameters of the two driven pulleys 64, 94 are equal to each other and the outer diameter of the drum portion 100 is greater than the diameter of the sprocket 66, the synchronism drive device 118 can rotate, in a state in which the cover tape 28 is not wound around the drum portion 100, the first member 86 at a speed corresponding to a peripheral speed of the drum portion 100 that is higher than a speed at which the carrier tape 20 is fed.

As the amount of the cover tape 28 taken up around the drum portion 100 of the second member 88 increases, i.e, as the diameter of the cover tape 28 taken up around the drum portion 100 increases, the rotation angle of the second member 88 needed to take up one pitch of the cover tape 28 decreases and the amount of sliding of the first member 86 relative to the second member 88 increases.

When the first member 86 is rotated relative to the second member 88, the relative angular phase between the two members 86, 88 changes. However, since each of the permanent magnet 104, the magnetic portion of the annular member 92, and the friction surfaces 106, 110 has an annular shape, the magnetic attraction force exerted from the permanent magnet 104 to the magnetic portion or the friction force produced between the two friction surfaces 106, 110 is not zeroed although the relative angular phase between the first and second members 86, 88 changes. That is, the first and second members 86, 88 are continuously held in frictional contact with each other and the magnetic attraction force is continuously exerted to the magnetic portion.

When the cover-tape take-up reel 84 becomes full of the cover tape 28 taken up from the CC carrier tape 20, the operator first rewinds a short length of the taken-up cover tape 28 by rotating the second member 88, against the friction force due to the magnetic attraction force, in a direction opposite to the direction in which the second member 88 has taken up the cover tape 28, then cuts the cover tape 28, and removes the second member 88 from the first member 86. The second member 88 can be removed from the first member 86 by applying a force greater than the magnetic attraction force, to the second member 88 in a direction in which the drum portion 100 of the second member 88 is separated from the annular member 92 of the first member 86. Subsequently, the operator attaches a new or empty second member 88 to the first member 86. More specifically described, the operator fits the drum portion 100 on the axis member 90 while making the guide portion 93 guide the drum portion 100, and causes the permanent magnet 104 to contact the annular member 92. In addition, the operator winds the cut end portion of the cover tape 28 remaining on the CC feeder 10, around the drum portion 100 of the new second member 88. This cut end portion of the cover tape 28 has a sufficient length because it has been rewound in advance from the prior first member 88 before it is cut. Therefore, the operator does not have to uselessly feed any length of the remaining carrier tape 20 or peel any length of the remaining cover tape 28 from the remaining base tape 22, for the purpose of winding the cut end portion of the remaining cover tape 28 around the new second member 88. The current CC carrier tape 20 is replaced with a new CC carrier tape 20 before the current tape 20 is completely consumed. For example, the operator first removes the current tape 20 remaining in the reel 34, from the reel 34, and then replaces the empty reel 34 with a new reel 34 around which a new full-length tape 20 is wound. In addition, the operator connects the trailing end portion of the current tape 20 to the leading end portion of the new tape 20. The timing of replacing of the current and new second members 88 may, or may not, coincide with the timing of replacing of the current and new reels 34. In either case, the operator does not have to waste any length of the carrier tape 20, i.e., any CCs 26 by rewinding a sufficient length of the taken-up cover tape 28 from the current second member 88 and then cutting the taken-up cover tape 28 off the remaining cover tape 28. The current second member 88 thus replaced with the new second member 88 is used again as another new second member 88 after the taken-up cover tape 28 is fully rewound and removed therefrom.

As is apparent from the foregoing description, in the present embodiment, the cover-tape take-up device 16 includes the cover-tape take-up reel 84 as a tape take-up, and the take-up reel 84 includes the first and second members 86, 88. The first member 86 includes, as an integral portion thereof, the driven pulley 94 which provides a driven portion or a driven rotatable member and which provides a drive portion which drives or rotates the second member 88. However, it is possible to regard the second member 88 as a tape take-up and regard the first member 86 as a drive member which is rotatable to drive or rotate the second member 88 as the tape take-up.

Figure 6:
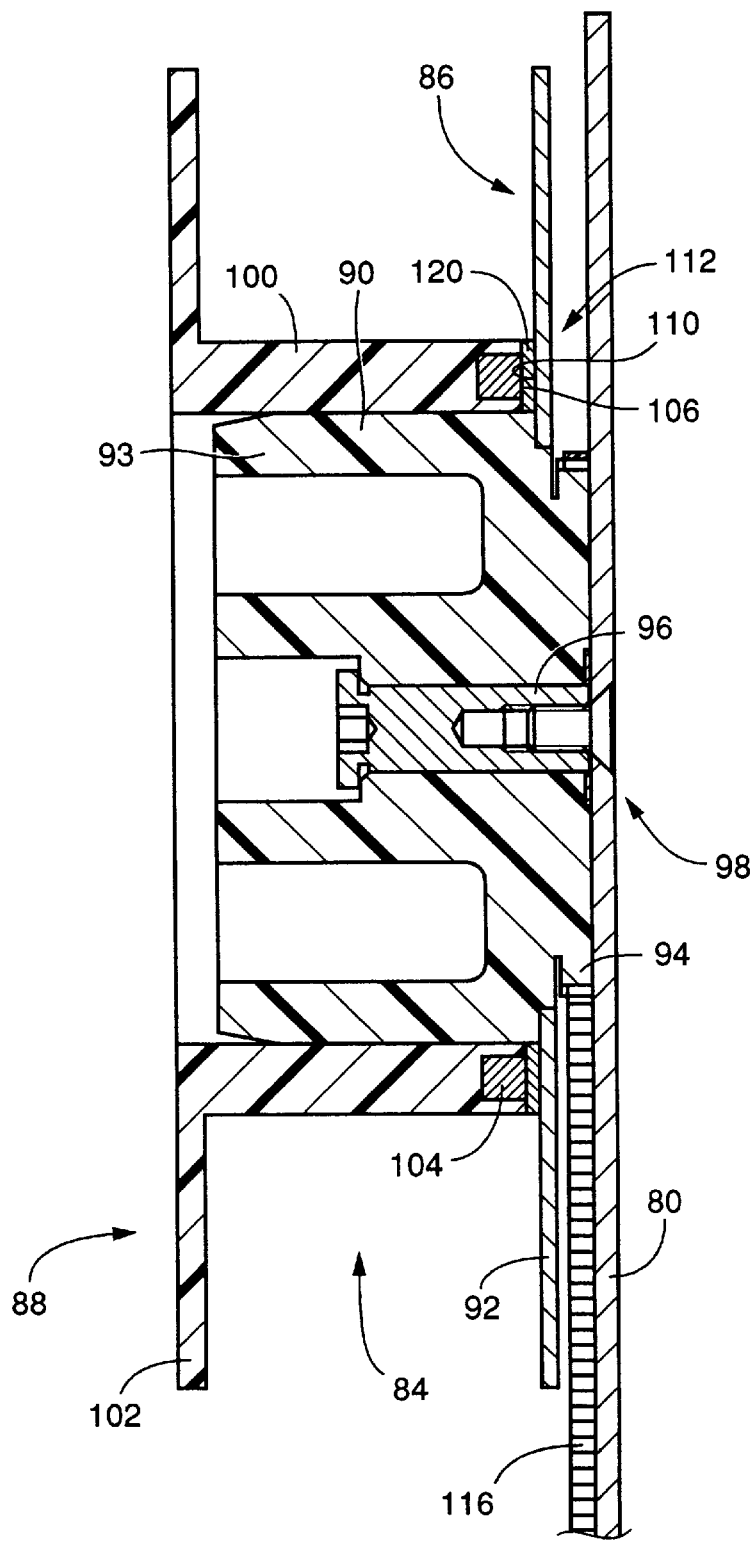
FIG. 6 is a cross-sectioned, side elevation view of another cover-tape take-up reel as another embodiment of the present invention.

In the first embodiment shown in FIGS. 1 to 5, the magnetic attraction force exerted by the permanent magnet 104 to the magnetic portion of the annular member 92 takes a predetermined value. However, the magnetic attraction force may be adjusted. FIG. 6 shows a second embodiment of the present invention which relates to a cover-tape take-up reel 84 which may be employed in the cover-tape take-up apparatus 18 shown in FIG. 1. The same reference numerals as used in the first embodiment are used to designate the corresponding elements or parts of the second embodiment, and the description thereof is omitted. In the second embodiment, before a drum portion 100 of a second member 88 is fitted on an axis member 90 of a first member 86, an annular spacer member 120 formed of a non-magnetic material such as brass is fitted on the axis member 90. Thus, a permanent magnet 104 is held in contact with an annular member 92 via the spacer 120. An appropriate one of a plurality of spacers 120 having different thickness values is selected and used to adjust the distance between the permanent magnet 104 and a magnetic portion of the annular member 92 and thereby adjust a magnetic attraction force exerted by the magnet 104 to the magnetic portion. The adjusting of the magnetic attraction force results in adjusting a friction force produced between respective friction surfaces 106, 110 of the magnet 104 and the magnetic portion. The magnetic attraction force may be adjusted depending upon the change of a tensile force of a cover tape 28 or the change of a magnetic force of the permanent magnet 104. The present cover-tape take-up reel 84 is applicable to not only a CC carrier tape 20 of an embossed type, shown in FIGS. 3 and 4, which has a number of CC accommodating pockets 24 projecting downward between a pair of side portions thereof which are to be supported by the main frame 36 of the CC feeder 10, but also a CC carrier tape of a type which includes (a) a base tape having a constant thickness in both a lengthwise and a widthwise direction thereof, and having a number of CC accommodating pockets at a predetermined pocket pitch in the lengthwise direction thereof, and (b) a cover tape adhered to the base tape. In the case of the second carrier tape, the bottom surface of a portion of the base tape that defines the pockets is supported by the main frame 36 of the CC feeder 10. When the operator sets, on the CC feeder 10, a carrier tape of a first sort and then sets a carrier tape of a second sort different from the first sort, respective cover tapes of the first and second carrier tapes may differ from each other and may exhibit different tensile forces. Depending upon the tensile force of each of the first and second carrier tapes, the operator can adjust the magnetic attraction force such that a drive torque applied to the second member 88 because of the friction force produced between the two friction surfaces 106, 110 due to the adjusted magnetic attraction force is smaller than a resistance torque applied to the second member 88 because of the tensile force. That is, depending upon the tensile force, a thicker or thinner spacer 120 is selected and used to adjust the magnetic attraction force. Meanwhile, if the magnetic force of the permanent magnet 104 decreases with time, a thinner spacer 120 is selected and used, or no spacer 120 is used to allow the magnet 104 to directly contact the magnetic portion of the annular member 92. In either case, the magnetic attraction force can be maintained.

Alternatively, it is possible to adjust the magnetic attraction force by employing a number of spacers each having a predetermined thickness and changing the number of spacers used for insertion between the magnet 104 and the annular member 92.

Figure 7:
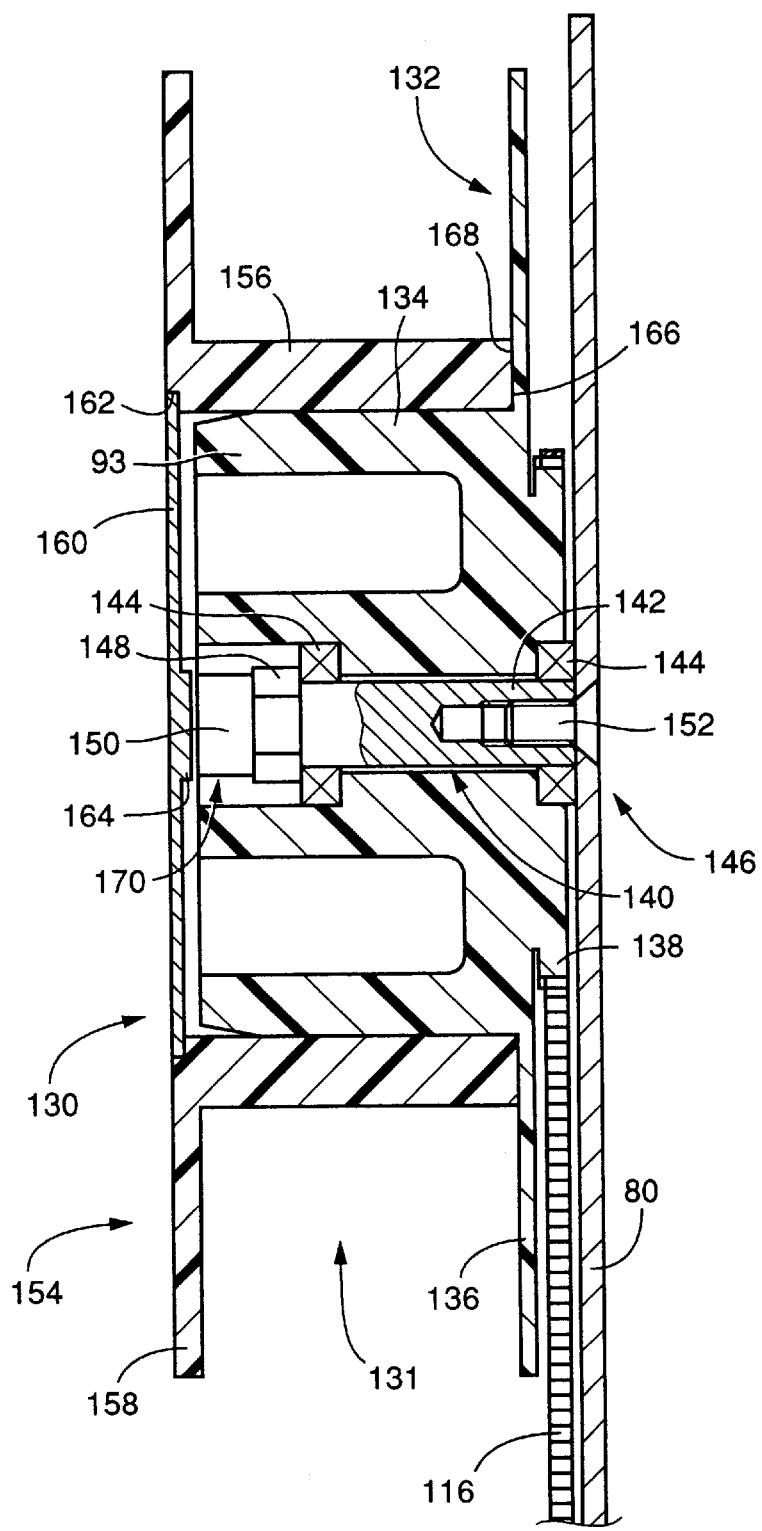
FIG. 7 is a cross-sectioned, side elevation view of another cover-tape take-up reel of another cover-tape take-up apparatus as another embodiment of the present invention.

In each of the first and second embodiments, the cover-tape take-up reel 84 includes the annular permanent magnet 104 and the annular magnetic portion, and the permanent magnet 104 and the magnetic portion are held in direct or indirect contact with each other at the respective friction surfaces 106, 110 thereof. In addition, the second member 88 includes the permanent magnet 104, and the first member 86 includes magnetic portion. However, it is possible to employ a permanent magnet and a magnetic portion each of which has a circular cross section and dispose the two elements on an axis line about which a first member and a second member are rotated relative to each other. In this case, it is possible to additionally employ a supporting device which supports the permanent magnet. In addition, it is possible that the second member include the magnetic portion and that the first and second members be held in frictional contact with each other at respective portions thereof apart from the permanent magnet and the magnetic portion. For example, FIG. 7 shows a third embodiment of the present invention which relates to a cover-tape take-up apparatus 130 having the above-indicated structural features. The cover-tape take-up apparatus 130 may be employed in the CC feeder 10 shown in FIG. 1.

The cover-tape take-up apparatus 130 includes a cover-tape take-up reel 131 which includes a first member 132 and a second member 154. The first member 132 is formed of a synthetic resin, and includes an axis portion 134 having a circular cross section, a flange portion 136 projecting radially outward from one of axially opposite end portions of the axis portion 134, and a driven pulley 138 as an integral portion thereof. The diameter of the driven pulley 138 is equal to that of the driven pulley 64 formed integrally with the sprocket 66 of the tape feeding device 14 shown in FIG. 1. The first member 132 is fitted on an axis portion 142 of an axis member 140 fixed to a bracket 80, via a pair of rolling bearings 144, such that the first member 132 is rotatable relative to the axis member 140 but is not movable relative to the same 140 in its axial direction. Each rolling bearing 144 can bear both a radial load and a thrust load. A small clearance is provided between the driven pulley 138 and the bracket 80. The axis member 140 cooperates with the bracket 80 to provide the supporting device which supports a solid permanent magnet 150 having a circular cross section. The permanent magnet 150 is fixed to an end face of a hexagonal head portion 148 of the axis member 140, in an appropriate manner such as using an adhesive. When an operator fixes the axis member 140 to the bracket 80, the operator first fits the first member 132 and the bearings 144 on the axis portion 142 of the axis member 140, and then engages a tool with the head portion 148 of the axis member 140, thereby preventing the axis member 140 from being rotated relative to the bracket 80. In this state, the axis member 140 is fixed to the bracket 80 with a screw 152. The axis portion 134 has a tapered guide portion 93 similar to the tapered guide portion 93 of the axis member 90 employed in the first embodiment. A drive belt 116 transmits the rotation of the drive pulley 60 to the driven pulley 138. Thus, the drive pulley 60, the drive belt 116 and the driven pulley 138 provide respective elements of a synchronism drive device as a rotating device. This synchronism drive device is similar to the synchronism drive device 118 of the cover-tape take-up apparatus 16 shown in FIG. 1, although the other elements than the elements 116, 138 are not shown in FIG. 7.

The second member 154 includes a cover-tape take-up drum portion 156 formed of a synthetic resin, a flange portion 158 projecting radially outward from one of axially opposite end portions of the drum portion 156, and a circular plate 160 formed of iron. The drum portion 156 has an annular recess 162 formed in an end face of the above-indicated one end portion thereof from which the flange portion 158 extends. The circular plate 160 is fitted in the annular recess 162. The circular plate 160 has a central projection 164 having a circular cross section. The central projection 164 provides a magnetic portion, or an attracted member which is magnetically attracted by the permanent magnet 150. The diameter of the drum portion 156 is larger than that of the sprocket 66 of the tape feeding device 14.

When an operator attaches the second member 154 to the first member 132, the operator first fits the drum portion 156 of the second member 154 on the axis portion 134 of the first member 132, and then fits the circular plate 160 in the annular recess 162 of the drum portion 156. In a state in which the drum portion 156 contacts the first flange portion 136, a small clearance is left between the projection 164 and the permanent magnet 150. The permanent magnet 150 exerts a magnetic attraction force to the projection 164, so that the drum portion 156 is forced via the circular plate 160 to contact the first flange portion 136. That is, the drum portion 156 is held in frictional contact with the first flange portion 136, at respective annular friction surfaces 166, 168 thereof. The permanent magnet 150 and the projection 164 cooperate with each other to provide a magnetic pressing device 170. The clearance or distance between the projection 164 and the magnet 150 and the magnetic force of the magnet 150 are so prescribed to provide an appropriate magnetic attraction force which results in producing an appropriate frictional force between the frictional surfaces 166, 168. Since the circular plate 160 is attracted by the permanent magnet 150, the plate 160 is prevented from coming off the second member 154, though the plate 60 is just fitted in the recess 162. However, it is possible to fix the plate 160 to the second member 154 in an appropriate manner such as using an adhesive. The operator can remove the second member 154 from the first member 132, by applying, to the second member 154, a force greater than the magnetic attraction force in a direction in which the drum portion 156 is separated from the axis portion 134. In the third embodiment, too, it is possible to regard the second member 154 as a tape take-up and regard the first member 132 as a drive member which is rotatable to drive or rotate the second member 154 as the tape take-up.

When the operation of the motor 54 is started to feed the CC carrier tape 20, the sprocket 66 is rotated and simultaneously the first member 132 is rotated. Because of the friction force produced between the friction surfaces 166, 168 due to the magnetic attraction force, the second member 154 is rotated so that the drum portion 156 takes up the cover tape 28 being peeled off the base tape 22 of the CC carrier tape 20 being fed by the tape feeding device 14. Since the respective diameters of the driven pulley 138 and the driven pulley 64 are equal to each other and the diameter of the drum portion 156 is greater than that of the sprocket 66, the second member 154 is subjected to a tensile force of the cover tape 28, already when a cover-tape take-up operation starts. When a resistance torque applied to the second member 154 due to the tensile force of the cover tape 28 exceeds a drive torque applied to the same 154 due to the friction force produced between the friction surfaces 166, 168 due to the magnetic attraction force, the first member 132 is rotated or slid relative to the second member 154 while being held in frictional contact with each other. Thus, the drum portion 156 can take up each pitch of the cover tape 28 at a peripheral speed equal to a speed at which the carrier tape 20 is fed by the tape feeding device 14.

A pair of friction surfaces may be provided apart from a permanent magnet and a magnetic portion, in other manners than that shown in FIG. 7. For example, in each of the first or second embodiments, the annular permanent magnet 104 may be fitted in the annular recess formed in the end face of the drum portion 100, such that an exposed surface of the permanent magnet 104 that is opposed to the annular member 92 is not flush with the end surface of the drum portion 100 and accordingly cannot contact the annular member 92. In this case, the end face of the drum portion and a surface of the annular member 92 that is opposed to the end face provide two friction surfaces, respectively, and a portion of the annular member 92 that is opposed to the magnet 104 provides a magnetic portion. Otherwise, it is possible that the permanent magnet be supported by the drum portion 100 and that the drum portion 100 and the axis member 90 have respective contact surfaces extending perpendicularly to an axis line about which the take-up reel 84 is rotatable. The amount of fitting of the drum portion 100 on the axis member 90 is limited by contacting of the two contact surfaces. The two contact surfaces prevent the permanent magnet 104 from contacting the annular member 92. The two contact surfaces provide two friction surfaces, respectively.

In each of the illustrated embodiments, the tape feeding device 14 includes the motor 54 as the drive source thereof, and feeds the CC carrier tape 20 by transmitting the rotation of the motor 54 via the drive pulley 60 and other members to the sprocket 66 and thereby rotating the same 66. However, the CC feeder 10 may employ a different tape feeding device which includes a ratchet wheel formed integrally with the sprocket 66, and a rotating device for rotating the ratchet wheel at a predetermined angular pitch. In this case, the cover-tape take-up apparatus 16, 130 may be replaced with one which rotates the cover-tape take-up reel 84, 131 by utilizing the rotation of the ratchet wheel. For example, a drive pulley is formed integrally with the ratchet wheel, and the rotation of the drive pulley is transmitted to the driven pulley 94, 138 formed integrally with the first member 86, 132 via the drive belt 116. Thus, the take-up reel 84, 131 is rotated in synchronism with the feeding of the CC carrier tape 20. In this case, too, the peripheral speed of the drum portion 100, 156 is made higher than the speed of feeding of the carrier tape 20, like in each of the illustrated embodiments.

In addition, it is possible to employ two separate drive sources one of which is for a sprocket rotating device which rotates the sprocket 66 and the other of which is for a reel rotating device which rotates the cover-tape take-up reel 84, 131. Otherwise, it is possible to provide, outside the CC feeder 10, a drive source and a drive member of a rotating device which rotates the sprocket 66 or the take-up reel 84, 131. In the latter case, the outside drive member drives a driven member provided on the CC feeder 10, so as to rotate the sprocket 66 or the take-up reel 84, 131.

It is not essentially required that the feeding of the CC carrier tape 20 be performed in synchronism with the taking up of the cover tape 28. It is possible to perform the two operations at different timings. For example, in the case where a tape-feeding operation and a tape-feeding preparing operation are alternately performed and a cover-tape taking-up operation and a cover-tape-taking-up preparing operation are alternately performed, the tape-feeding operation and the cover-tape-taking-up preparing operation may be performed in synchronism with each other, and the tape-feeding preparing operation and the cover-tape taking-up operation may be performed in synchronism with each other.

In each of the illustrated embodiments, the cover-tape take-up apparatus 16, 130 also functions as the cover-tape peeling device. However, it is possible to employ a cover-tape peeling device separate from the cover-tape take-up apparatus 16, 130. For example, a cover-tape peeling device including a pair of pinch rollers may be between the cover member 72 and the cover-tape take-up apparatus 16, 130. One of the two pinch rollers is a drive pinch roller which is rotated by the drive force transmitted thereto from a drive source, and the other pinch roller is an idling roller which is pressed against the drive pinch roller with a predetermined pressing force. An end portion of the cover tape 28 is pinched between the two pinch rollers. As the two pinch rollers feed a portion of the cover tape 28 that has been peeled off the base tape 22, toward the take-up reel 84, 131, another portion of the cover tape 28 is newly peeled off the base tape 22. The amount of rotation of the pinch rollers per unit time is greater than the amount of feeding of the carrier tape 20 per unit time. The excessive amount of rotation of the pinch rollers is absorbed by the sliding of the pinch rollers on the cover tape 28. The cover-tape peeling device and the cover-tape take-up apparatus 84, 130 may employ a common drive source, or may employ respective exclusive drive sources.

In each of the illustrated embodiments, the motor 54 as the common drive source of the tape feeding device 14 and the synchronism drive device 118 is a stepper motor as a sort of electric motor which is controllable with respect to its rotation angle or amount. However, the stepper motor may be replaced with a servomotor.

In each of the illustrated embodiments, the first member 86, 132 has the first flange portion 92, 136 and the second member 88, 154 has the second flange portion 102, 158. However, it is possible to modify the second member 88, 154 to have two flange portions. In the case where a permanent magnet is supported by the drum portion 100, 156 of the second member 88, 154, the first member 86, 132 may employ an annular member whose outer diameter is equal to that of the drum portion 100, 156. In this case, too, the annular member may have a surface which is opposed to the permanent magnet.

In each of the illustrated embodiments, the rotation of the driven gear 58 is transmitted by the common drive pulley 60 to the driven pulley 64 of the tape feeding device 14 and the driven pulley 94, 138 of the synchronism drive device 118. However, the common drive pulley 60 may be replaced with two exclusive drive pulleys one of which cooperates with the drive belt 62 to transmit the rotation to the driven pulley 64 and the other of which cooperates with the drive belt 116 to transmit the rotation to the driven pulley 94, 138. The driven gear 58 and the above two drive pulleys are attached to a common axis member such that each of the driven gear 58 and the two drive pulleys is not rotatable relative to the axis member. In this case, the respective diameters of the two drive pulleys may, or may not, be equal to each other. The respective diameters of the two drive pulleys, the diameter of the driven pulley 64 of the tape feeding device 14, the diameter of the driven pulley 94, 138 of the drive device 118, the diameter of the sprocket 66, and the outer diameter of the drum portion 100, 156 are so prescribed that in a state in which no cover tape 28 is wound around the drum portion 100, 156, the peripheral speed of the drum portion 100, 156 is not lower than the speed of feeding of the CC carrier tape 20. The respective tooth pitches of the two timing belts 62, 116 each of which is a timing or cog belt may, or may not, be equal to each other. In the case where the respective tooth pitches of the two timing belts 62, 116 differ from each other, the tooth pitch of one of the above two drive pulleys and its corresponding one of the two driven pulleys 64, 94 (138) differs from that of the other drive pulley and its corresponding driven pulleys 94 (138), 64.

In each of the illustrated embodiments, it is possible to employ a plurality of second members 88, 154 wherein respective drum portions thereof have different axial lengths corresponding to different sorts of cover tapes 28 having different widths. In this case, an operator selects an appropriate one of the second members 88, 154, depending upon the width of the cover tape 28 to be taken up, and attaches the selected second member 88, 154 to the first member 86, 132. In this case, it is preferred that the axis length of the axis member 90 or the axis portion 134 be shorter than the smallest axial length of all the respective axial lengths of the respective drum portions of the second members 88, 154.

Whether in the above-indicated modified case where an appropriate one of the second members 88, 154 whose respective drum portions have different axial lengths is selected and attached to the first member 86, 132, or in the illustrated embodiments where each of the second members 88, 154 whose respective drum portions have a predetermined axial length is attached to the first member 86, 132, the axial length of the axis member or portion 90, 134 of the first member 86, 132 may be shortened because, for example, in the case where the diameter of the drum portion is great and accordingly respective friction surfaces of the drum portion and the first member are held in frictional contact with each other at a position radially distant from the axis line about which the first and second members are rotated relative to each other, the frictional contact effectively contributes to preventing the second member from being inclined relative to the first member.

In each of the illustrated embodiments, the first member 86, 132 includes the driven pulley 94, 138 as an integral portion thereof. However, it is possible to employ a driven pulley separate from the first member 86, 132, and a connecting device which connects the driven pulley to the first member 86, 132 such that the driven pulley is not rotatable relative to the first member 86, 132.

In each of the first and second embodiments, the first member 86 includes the magnetic portion, and the second member 88 includes the permanent magnet 104. However, the first member 86 may include a permanent magnet, and the second member 88 may include a magnetic portion which is magnetically attracted by the magnet.

In the third embodiment, the supporting device 146 supports the permanent magnet 150, and the second member 154 includes the magnetic portion. However, the supporting device 146 may support a magnetic portion, and the second member 154 may include a permanent magnet which magnetically attracts the magnetic portion.

It is to be understood that the present invention may be embodied with other changes, improvements, and modifications that may occur to those skilled in the art without departing from the scope and spirit of the invention defined in the appended claims.

What is claimed is:

1. A tape take-up for taking up a tape, comprising:

a first member having a first friction surface; and a second member comprising a drum portion for taking up the tape, and having a second friction surface, said drum portion having an axis line, at least one of the first and second friction surfaces comprising an annular friction surface concentric with the drum portion, the first and second members being combined with each other such that the first and second members are rotatable relative to each other about the axis line of the drum portion while the first and second friction surfaces are held in contact with each other, one of the first and second members comprising a permanent magnet, the other of the first and second members comprising a magnetic portion formed of a magnetic material, the permanent magnet and the magnetic portion having respective shapes which ensure that the permanent magnet and the magnetic portion are opposed to each other at any relative angular phase between the first and second members, the permanent magnet exerting, to the magnetic portion, a magnetic attraction force which causes the first and second friction surfaces to be held in contact with each other while the second member is not subjected to an external force greater than the magnetic attraction force, the magnetic attraction force permitting the second member to be separated from the first member when the second member is subjected to the external force.

2. A tape take-up according to claim 1, wherein at least one of the permanent magnet and the magnetic portion has an annular shape.

3. A tape take-up according to claim 1, further comprising a driven member which is rotatable about the axis line, wherein the driven member is provided by an integral portion of the first member.

4. A tape take-up according to claim 1, wherein the magnetic portion comprises an annular magnetic portion.

5. A tape take-up according to claim 4, wherein the annular magnetic portion forms one of the first and second friction surfaces which is held in contact with the permanent magnet which forms the other of the first and second friction surfaces.

6. A tape take-up according to claim 4, wherein the permanent magnet of said one of the first and second members comprises a plurality of portions which are located at a plurality of locations, respectively, which are axially symmetrical with each other with respect to the axis line.

7. A tape take-up according to claim 4, wherein the permanent magnet comprises an annular permanent magnet, and wherein said one of the first and second members further comprises a support portion to which the annular permanent magnet is fixed such that the annular permanent magnet is opposed to the annular magnetic portion of said other of the first and second members.

8. A tape take-up according to claim 1, wherein the first member comprises (a) a generally cylindrical axis portion which is fitable in an inner space of the drum portion of the second member such that the axis portion and the drum portion are rotatable relative to each other about the axis line, and (b) a flange portion which extends radially outward from the axis portion.

9. A tape take-up according to claim 1, wherein the second member comprises a flange portion which extends radially outward from the drum portion.

10. A cover-tape take-up apparatus for taking up a cover tape which is peeled off a circuit-component carrier tape which includes, in addition to the cover tape, a base tape having, at a predetermined pitch in a lengthwise direction thereof, a plurality of pockets in which a plurality of circuit components are accommodated, respectively, and which are closed by the cover tape, the apparatus comprising:

a cover-tape take-up which comprises a first member having a first friction surface, and a second member comprising a drum portion for taking up the cover tape, and having a second friction surface, at least one of the first and second friction surfaces comprising an annular friction surface concentric with the drum portion, the first and second members being combined with each other such that the first and second members are rotatable relative to each other about an axis line of the drum portion while the first and second friction surfaces are held in contact with each other;

a supporting device which supports the cover-tape take-up such that the cover-tape take-up is rotatable about the axis line;

a magnetic pressing device which comprises a permanent magnet and an attracted member formed of a magnetic material, and which exerts, in at least a state in which the cover-tape take-up is supported by the supporting device, a magnetic attraction force to the attracted member and thereby causes the first and second friction surfaces of the first and second members to be pressed on each other, the magnetic attraction force permitting the second member to be separated from the first member when the second member is subjected to an external force greater than the magnetic attraction force; and a rotating device which rotates the first member at a predetermined angular pitch about the axis line.

11. A cover-tape take-up apparatus for taking up a cover tape which is peeled off a circuit-component carrier tape which includes, in addition to the cover tape, a base tape having, at a predetermined pocket pitch in a lengthwise direction thereof, a plurality of pockets in which a plurality of circuit components are accommodated, respectively, and which are closed by the cover tape, the apparatus comprising:

a drive member which is rotatable about an axis line and has a first friction surface;

a supporting device which supports the drive member such that the drive member is rotatable about the axis line;

a rotating device which rotates the drive member at a predetermined angular pitch about the axis line;

a cover-tape take-up which comprises a drum portion for taking up the cover tape, and has a second friction surface, at least one of the first and second friction surfaces comprising an annular friction surface whose center is located on the axis line, the first and second friction surfaces contacting with each other in a direction parallel to the axis line, the cover-tape take-up being rotated about the axis line by a drive torque resulting from a friction between the first and second friction surfaces, when the drive member is rotated by the rotating device, so that the drum portion takes up the cover tape, the cover-tape take-up being rotated relative to the drive member when the cover-tape take-up is subjected to a resistant torque greater than the drive torque; and a magnetic pressing device which comprises a permanent magnet and an attracted member formed of a magnetic material, and which exerts, in at least a state in which the cover-tape take-up is supported by the supporting device, a magnetic attraction force to the attracted member and thereby causes the first and second friction surfaces of the drive member and the cover-tape take-up to be pressed on each other, the magnetic attraction force permitting the cover-tape take-up to be separated from the drive member when the cover-tape take-up is subjected to an external force greater than the magnetic attraction force.

12. A cover-tape take-up apparatus according to claim 11, wherein the rotating device comprises a synchronism rotating device which rotates, in synchronism with a feeding of the circuit-component carrier tape at a predetermined feeding pitch equal to the predetermined pocket pitch, the drive member at a speed corresponding to a circumferential speed of the drum portion of the cover-tape take-up which is not lower than a speed of the feeding of the carrier tape.

* * * * *